(12) United States Patent
Kashkoush et al.

(10) Patent No.: US 10,991,589 B2
(45) Date of Patent: *Apr. 27, 2021

(54) CORRELATION BETWEEN CONDUCTIVITY AND PH MEASUREMENTS FOR KOH TEXTURING SOLUTIONS AND ADDITIVES

(71) Applicant: NAURA Akrion, Inc., Allentown, PA (US)

(72) Inventors: Ismail Kashkoush, Orefield, PA (US); Jennifer Rieker, Whitehall, PA (US); Gim-Syang Chen, Allentown, PA (US); Dennis Nemeth, Nazareth, PA (US)

(73) Assignee: NAURA Akrion, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 16/237,302

(22) Filed: Dec. 31, 2018

(65) Prior Publication Data

US 2019/0148193 A1 May 16, 2019

Related U.S. Application Data

(63) Continuation of application No. 14/703,459, filed on May 4, 2015, now Pat. No. 10,170,350.

(60) Provisional application No. 61/987,636, filed on May 2, 2014.

(51) Int. Cl.
*H01L 21/306* (2006.01)
*H01L 21/66* (2006.01)
*H01L 21/67* (2006.01)
*H01L 31/0236* (2006.01)

(52) U.S. Cl.
CPC .. *H01L 21/30604* (2013.01); *H01L 21/67075* (2013.01); *H01L 21/67086* (2013.01); *H01L 21/67253* (2013.01); *H01L 22/10* (2013.01); *H01L 22/26* (2013.01); *H01L 31/02363* (2013.01); *Y02E 10/50* (2013.01)

(58) Field of Classification Search
CPC ........ H01L 21/67253; H01L 31/02363; H01L 21/67086; H01L 22/26; H01L 22/10; H01L 21/30604; H01L 21/67075; Y02E 10/50
USPC ............................... 438/745; 216/83, 84, 86
See application file for complete search history.

(56) References Cited

U.S. PATENT DOCUMENTS

| | | | |
|---|---|---|---|
| 6,261,845 B1 * | 7/2001 | Verhaverbeke | G01N 35/08 134/18 |
| 6,532,974 B2 | 3/2003 | Kashkoush et al. | |
| 6,626,189 B2 | 9/2003 | Kashkoush et al. | |
| 6,649,018 B2 | 11/2003 | Novak et al. | |
| 6,766,818 B2 | 7/2004 | Kashkoush et al. | |
| 6,767,877 B2 | 7/2004 | Kuo et al. | |
| 6,818,563 B2 | 11/2004 | Novak et al. | |
| 6,837,944 B2 | 1/2005 | Kashkoush et al. | |

(Continued)

OTHER PUBLICATIONS

Abstract of JP2012178424A.

*Primary Examiner* — Duy Vu N Deo
(74) *Attorney, Agent, or Firm* — The Belles Group, P.C.

(57) ABSTRACT

The variability of an etchant concentration in an immersion processes for treatment of semiconductor devices can be significantly lowered by continuously measuring the conductivity of an etchant solution and comparing against predetermined thresholds. The etchant concentration can be maintained by a feed and bleed process based on conductivity measurements of the etchant solution and the conductivity measurements being correlated with premeasured pH values of an etchant solution.

9 Claims, 5 Drawing Sheets

(56) References Cited

U.S. PATENT DOCUMENTS

| | | |
|---|---|---|
| 6,840,250 B2 | 1/2005 | Kashkoush et al. |
| 6,842,998 B2 | 1/2005 | Kashkoush et al. |
| 6,863,836 B2 | 3/2005 | Novak et al. |
| 6,871,657 B2 | 3/2005 | Bottos et al. |
| 6,928,750 B2 | 8/2005 | Kashkoush et al. |
| 7,169,253 B2 | 1/2007 | Chen et al. |
| 7,311,847 B2 | 12/2007 | Kashkoush |
| 7,312,161 B2 | 12/2007 | Siefering et al. |
| 7,644,512 B1 | 1/2010 | Liu et al. |
| 7,976,718 B2 | 7/2011 | Kashkoush et al. |
| 8,056,253 B2 | 11/2011 | Liu et al. |
| 8,084,280 B2 | 12/2011 | Kashkoush et al. |
| 8,276,291 B2 | 10/2012 | Liu et al. |
| 8,628,678 B2 | 1/2014 | Viopio |
| 8,739,429 B2 | 6/2014 | Liu et al. |
| 8,741,066 B2 | 6/2014 | Kashkoush et al. |
| 2008/0023045 A1* | 1/2008 | Miller ............... H01L 21/67253 134/27 |
| 2009/0141583 A1 | 6/2009 | Fanjat |
| 2015/0318224 A1* | 11/2015 | Kashkoush ....... H01L 21/30604 438/5 |

\* cited by examiner

CORRELATION BETWEEN CONDUCTIVITY AND PH MEASUREMENTS FOR KOH TEXTURING SOLUTIONS AND ADDITIVES

CROSS-REFERENCE TO RELATED APPLICATIONS

This application is a continuation application of U.S. application Ser. No. 14/703,459, filed May 4, 2015, which claims the benefit of U.S. Provisional Application No. 61/987,636, filed on May 2, 2014. The disclosure of the above application is incorporated herein by reference.

BACKGROUND

Etching is a process that can texturize the surface of a silicon wafer. Silicon wafers having texturized surfaces are useful as solar cells as less incident light is reflected off the wafer surface. As a result more light energy is absorbed by the silicon, making the silicon wafer more efficient in energy capture. The pattern of the texture directly affects the reflectance of the solar cell.

Although the chemical reaction is well known, the anisotropic etching of silicon is a complex process. This is particularly true in the solar industry where a large mass of silicon is typically introduced into an etch bath. The etch by-products (silicates) affect the balance of the etching species. If adequate compensation is not made for these by-products, a significant drop in etch rate and an increase in contamination levels is typically noticed. Because of this contamination, production lines suffer from unpredictable wafer characteristics and lower cell performance. Previous attempts to control the etch rate included using refractory sensors for measuring the content of particulates in the etchant solution, which was used to calculate the progress of an etching reaction. Such methods are limited by the type of refractory sensor that may be effectively used to measure particulate amounts.

Thus, a need exists for a system and/or method that can effectively maintain consistent etch rate at a desired level over an entire bath life using measurement techniques other than refractory sensors. Furthermore, a need exists for a system and/or method that, produces consistent textorization patterns on the silicon wafers over the entire bath life.

BRIEF SUMMARY

Some embodiments of the present invention are directed to a method of generating a control process for maintaining concentration of an etchant solution based on conductivity of the etchant solution, the method comprising: a) immersing the at least one silicon substrate in the etchant solution; b) repetitively measuring conductivity of the etchant solution with a conductivity sensor; and wherein a lower threshold of conductivity is indicative of a lower threshold of etchant concentration in the etchant solution and an upper threshold of conductivity is indicative of an upper threshold of etchant concentration in the etchant solution, and wherein each of the upper and lower thresholds of concentration are within a predetermined range of a target etchant concentration of the etchant solution.

Other embodiments of the present invention are directed to a system for etching at least one substrate. The system may comprise a closed-loop circulation system, a conductivity sensor, and a controller. The system may further comprise a means for bleeding contaminated etchant solution from the circulation volume of the etchant solution. The system may further comprise a means for adding fresh etchant solution to the circulation volume of the etchant solution. In some embodiments, the closed-loop circulation system has a process chamber and a recirculation line fluidly coupled to the process chamber. The closed-loop circulation system may be configured to circulate a circulation volume of an etchant solution. The conductivity sensor may be operably coupled to the closed-loop circulation system and configured to repetitively measure conductivity of the circulation volume of the etchant solution. The controller may be configured so that upon detecting that the circulation volume of the etchant solution has an average measured conductivity over a predetermined period of time that is at or below a lower threshold of conductivity, the controller automatically performs two functions. The first function is to (1) activate the means for the bleeding contaminated etchant solution to bleed a volume of the contaminated etchant solution from the circulation volume of the etchant solution. The second function is to (2) activate the means for adding fresh etchant solution to add fresh etchant solution to the circulation volume of the etchant solution to increase the conductivity of the circulation volume of the etchant solution to a value that is greater than the lower threshold of conductivity but less than or equal to an upper threshold of conductivity.

In some embodiments, the present invention is directed to a method of etching material from at least one substrate, the method comprising: a) circulating a circulation volume of an etchant solution through a closed-loop circulation system and in contact with at least one silicon substrate to etch silicon from the at least one silicon substrate, the circulation volume of the etchant solution being at a known temperature; b) measuring conductivity of the circulation volume of the etchant solution circulating through the closed-loop circulation system; c) measuring pH of the circulation volume of the etchant solution circulating through the closed-loop circulation system; and d) assign an etchant concentration value to the measured conductivity of step b) based on the combination of the measured pH of step c); e) measure the pH of a closed-loop system and compare against the etchant concentration value and perform a feed-and-bleed event to the closed-loop system based on the etchant concentration value, the closed-loop system configured to etch a material.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION

The following description of the preferred embodiment(s) is merely exemplary in nature and is in no way intended to limit the invention, its application, or uses.

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

Unless otherwise specified, all percentages and amounts expressed herein and elsewhere in the specification should be understood to refer to percentages by weight. The amounts given are based on the active weight of the material.

Figure 1:
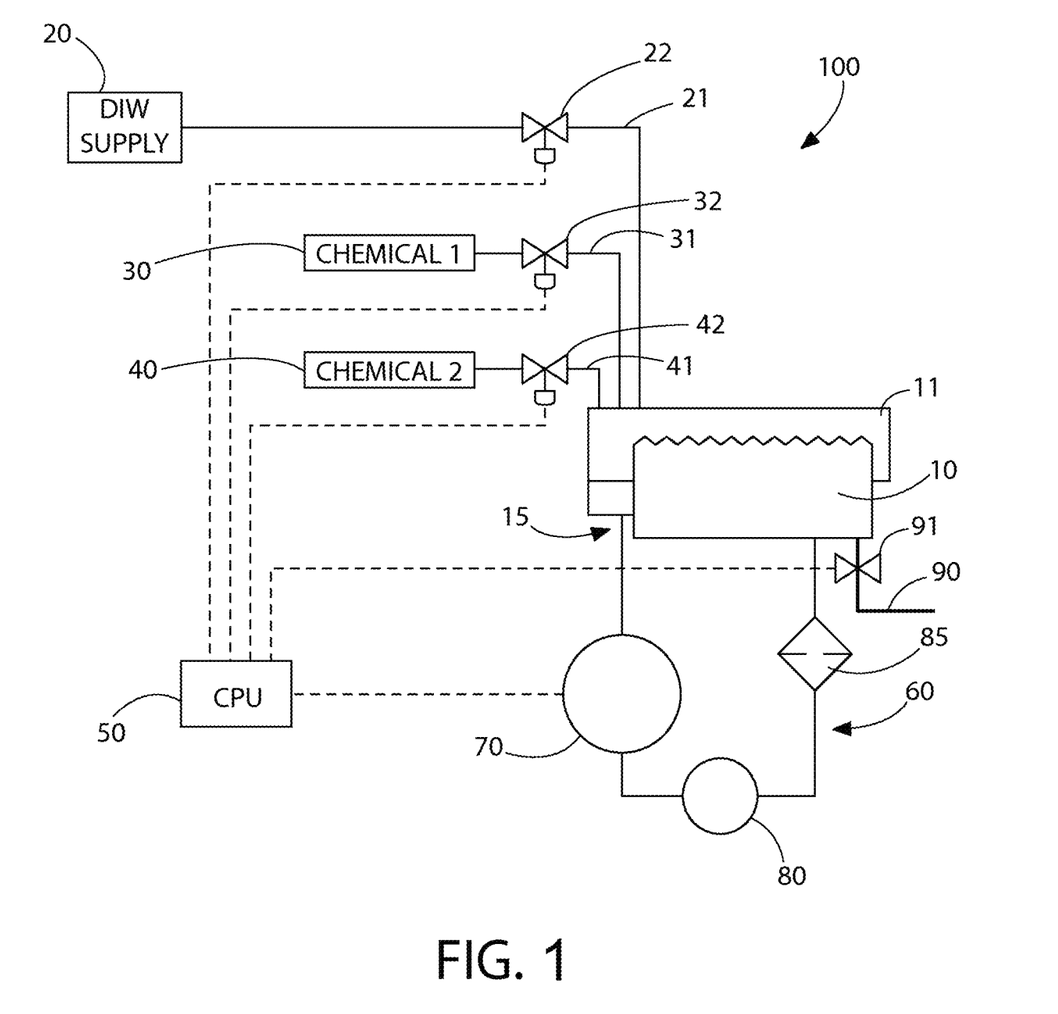
FIG. 1 is a schematic illustration of a selective etching system according to one embodiment of the present invention.

The present invention is directed to a system and a method for etching at least one substrate. As shown in FIG. 1, the system includes a process chamber 10 that houses a bath of an etchant solution, which is used to etch a substrate. The system employs a controller 50—also referred to as a central processing unit (CPU)—that is configured to employ a control process for maintaining a target concentration of the etchant solution in a circulation volume of a closed-loop circulation system 15. Specifically, the control process maintains the target concentration of the etchant in the etchant solution by repetitively measuring the solution conductivity (S/m)—also referred to as "conductivity"—of the etchant solution in the circulation volume, as discussed herein.

The control process of the present invention is generated according to a correlation method that requires two sensors. The first sensor is a control sensor that includes a pH sensor. The second sensor is a solution-conductivity (S/m) sensor—also referred to as the "conductivity sensor." Each of the first and the second sensors are operably coupled to the closed-loop circulation system and configured to repetitively measure the corresponding pH and solution conductivity of the circulation volume of the etchant solution.

In a first step, the etchant solution comprises an etchant selected from compounds such as nitric acid ($HNO_3$), hydrofluoric acid (HF), potassium hydroxide (KOH), sodium hydroxide (NaOH), and tetramethylammonium hydroxide (TMAH). The etchant solution may further comprise an amount of deionized water (DIW) as well as other additives, such as isopropyl alcohol (IPA) as well as organic surfactants. The etchant solution may comprise the etchant in a predetermined concentration that ranges from 0.5 wt. % to 20 wt. %. In some embodiments, the etchant is present in an amount ranging from 1 wt. % to 10 wt. % based on the total weight of the etchant solution—including all integers therebetween.

The correlation method next includes partially or fully immersing a substrate into the etchant solution. The substrate may include a material such as silicon (Si), silicon dioxide ($SiO_2$) or silicon nitride ($Si_3N_4$). Once immersed, the etching solution and substrate react, thereby etching the substrate according to established etching chemistry. During the etching reaction, the first sensor repeatedly measures the pH of the etchant solution in the circulation volume and the second sensor repeatedly measures the conductivity of the etchant solution in the circulation volume.

As the substrate is etched, the amount of available etchant in the etchant solution decreases as it is consumed by the etching reaction. With less available etchant, there is a corresponding decrease in the amount of available hydrogen ions in the etchant solution, which is measured by the pH sensor. Using established etching chemistry, known stoichiometric amounts of etchant and substrate, and the measured pH values, the reduction in available hydrogen ions (as measured by pH value) of the etchant solution can be used to calculate the specific amount of etchant that has been consumed by the etching reaction as well as the amount of available etchant that remains in the etchant solution. As a result, the pH sensor can effectively measure the change in etchant concentration in the etchant solution as the etching reaction progresses.

Figure 2:
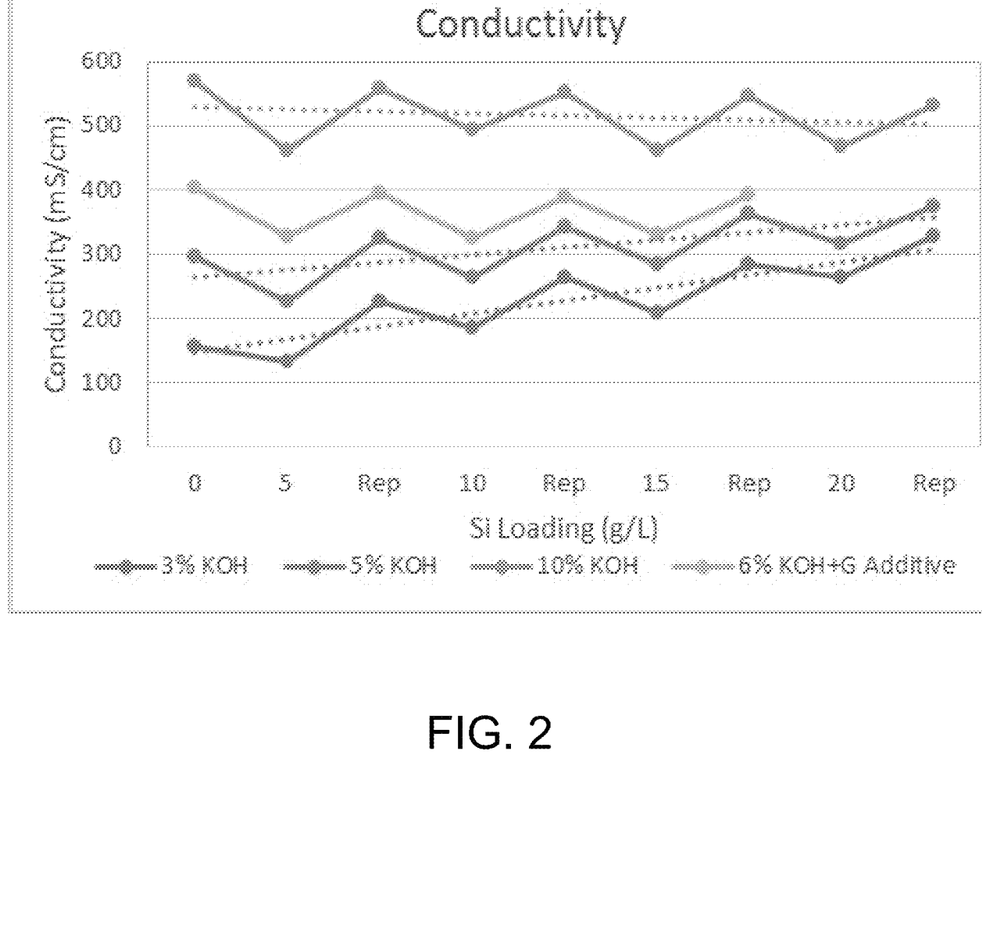
FIG. 2 is a graph illustrating stability of etch rates using the conductivity feed and bleed method according to some embodiments of the present invention.

As the etching reacting progresses and the etchant concentration continues to decrease, fresh etchant solution is added to the circulation volume. With the addition of the fresh etchant comes a corresponding bleeding of the contaminated etchant from the circulation volume. The volume of the fresh etchant solution and the volume of bled contaminated etchant solution are to be substantially equal. For the purposes of this invention, the term substantially refers to +/−5%. The addition of fresh etchant solution and the removal of contaminated etchant solution are referred to as a "feed and bleed." The removal of contaminated etchant solution and the addition of fresh etchant solution increase the overall amount of hydrogen ions in circulation volume of the etchant solution (as measured by the pH sensor). Thus, as shown in FIG. 2, the pH sensor can also effectively measure the amount of fresh etchant solution that is added to the circulation volume during the feed and bleed step. By actively measuring the amount of hydrogen ions, the pH sensor provides real-time feedback that can be used to adjust the amount of etchant in the circulation volume so that the actual etchant concentration in the circulation volume approaches the predetermined concentration—even as the etchant is consumed over time by the etching reaction.

Solution conductivity is also a measure of available ions in a solution. Therefore, a general relationship between the measured conductivity value of a circulation volume and the etchant concentration in the circulation volume also exists. However, for highly conductive solutions, measuring solution conductivity becomes increasingly ineffective as a tool for calculating etchant concentration because as the conductivity of a solution increases, changes in ion content related to the changes in etchant concentration become less significant. For highly conductive solutions, using conductivity measurements as a way to directly calculate a change in etchant concentration is only effective when that change is relative large, and, as a result the change in ion content is more pronounced. However, requiring such pronounced changes in ion content renders solution conductivity ineffective as a way to directly measure minor changes in etchant concentration for highly conductive solutions.

Figure 4:
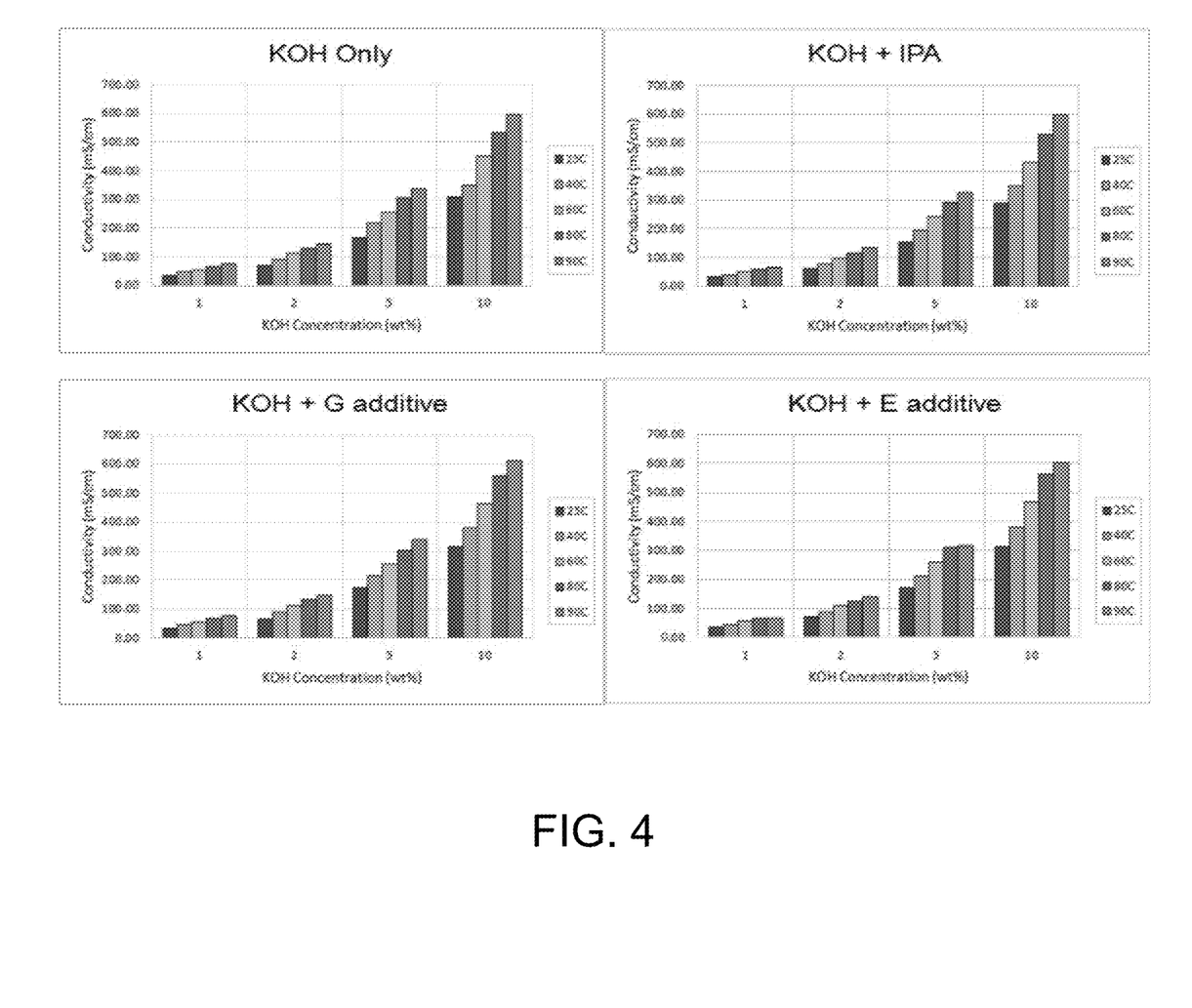
FIG. 4 is a graph illustrating temperature dependence of conductivity of etchant solution using the feed and bleed method according to some embodiments of the present invention.

As shown in FIG. 4, these difficulties are exacerbated at elevated temperatures because increased temperatures cause free ions to become more mobile, thereby increasing the solution conductivity and making minor changes ion content even less significant. Thus, previous attempts to use solution conductivity to measure change in etchant concentration were ineffective unless those changes were large and etching was performed at low temperatures. Therefore, previous attempts at using conductivity as a tool to maintain a target concentration of etchant during a substrate etching process resulted in large statistical variation in the amount of etchant that would be consumed and added during the etching process.

The difficulties associated with using conductivity as an effective measurement tool for etchant concentration have been overcome by the control process of the present invention—as discussed herein. The control process is the result of a relationship between the concentration of an etchant in an etchant solution and the measured pH values of the etchant solution correlated to measured conductivity values of the etchant solution.

The correlation method for generating the control process includes circulating a circulation volume of the etchant solution through a closed-loop circulation system. While circulating through the closed-loop, the circulation volume of the etchant solution is in contact with at least one substrate—during which the etchant solution etches the substrate. The circulation volume of the etchant solution is held at a known temperature. In some non-limiting embodiments, the temperature may range from 25° C. to 90° C.—including all integers there between.

Next, the conductivity sensor measures the conductivity of the circulation volume of the etchant solution through the closed-loop circulation system. The control sensor—i.e. the pH sensor—also measures the pH of the circulation volume of the etchant solution circulating through the closed-loop circulation system. The pH and conductivity measurements may each be the result of an average of a plurality of measurements performed over a period of time—so long as the same number of measurements and the same period of time were used for both the pH and the conductivity measurements. Subsequently, based on the measured pH value, an etchant concentration value is assigned to the measured conductivity value of the circulation volume of the etchant solution. The circulation volume may then be subject to numerous feed and bleed steps, wherein the pH and conductivity are repetitively measured. By correlating the empirical data from the pH measurements and the conductivity measurements, the correlation method can successfully establishes a working relationship between the previously insignificant measured conductivity values and the changing etchant concentrations of the circulation volume, which is used by the control process to measure etchant concentration based on conductivity measurements.

Figure 3:
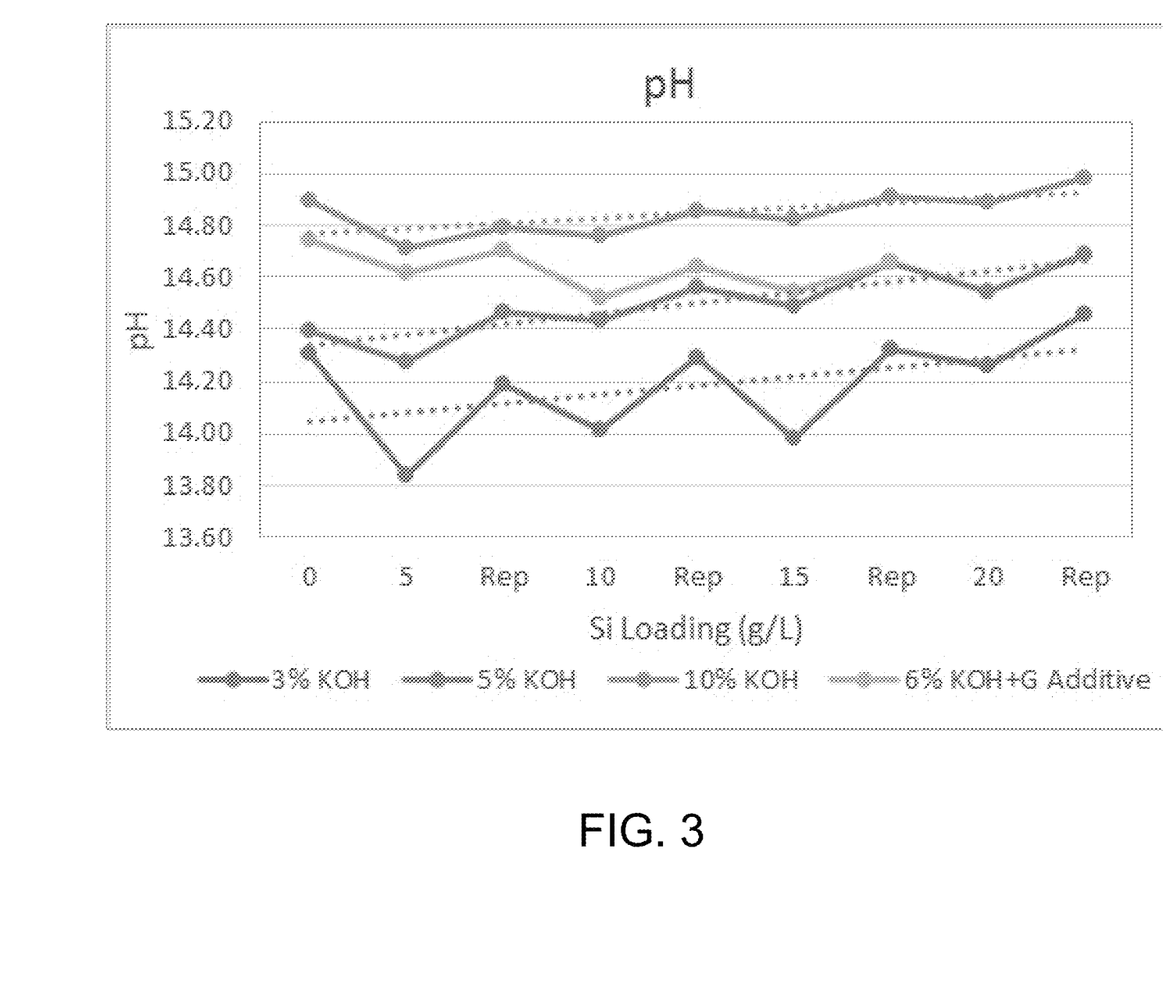
FIG. 3 is a graph illustrating a pH control of the stability of the etch rates using the feed and bleed method according to some embodiments of the present invention.

The relationship used by the control process overcomes the difficulty in finding significant variation in conductivity when attempting to measure minor changes in etchant concentration based on ion content of highly conductive solutions. The pH sensor is able to directly account for much smaller variations in etchant concentration as compared to the ability of the conductivity sensor to directly account for such variation. While the change in conductivity alone may remain as an insignificant indicator for directly measuring minor changes in etchant concentrations, through the control process, the change in conductivity under known conditions can now be used to indirectly indicate even minor changes in etchant concentration based on the side-by-side comparison of empirical pH data running under the same known conditions—as demonstrated by FIGS. 2 and 3.

Figure 5:
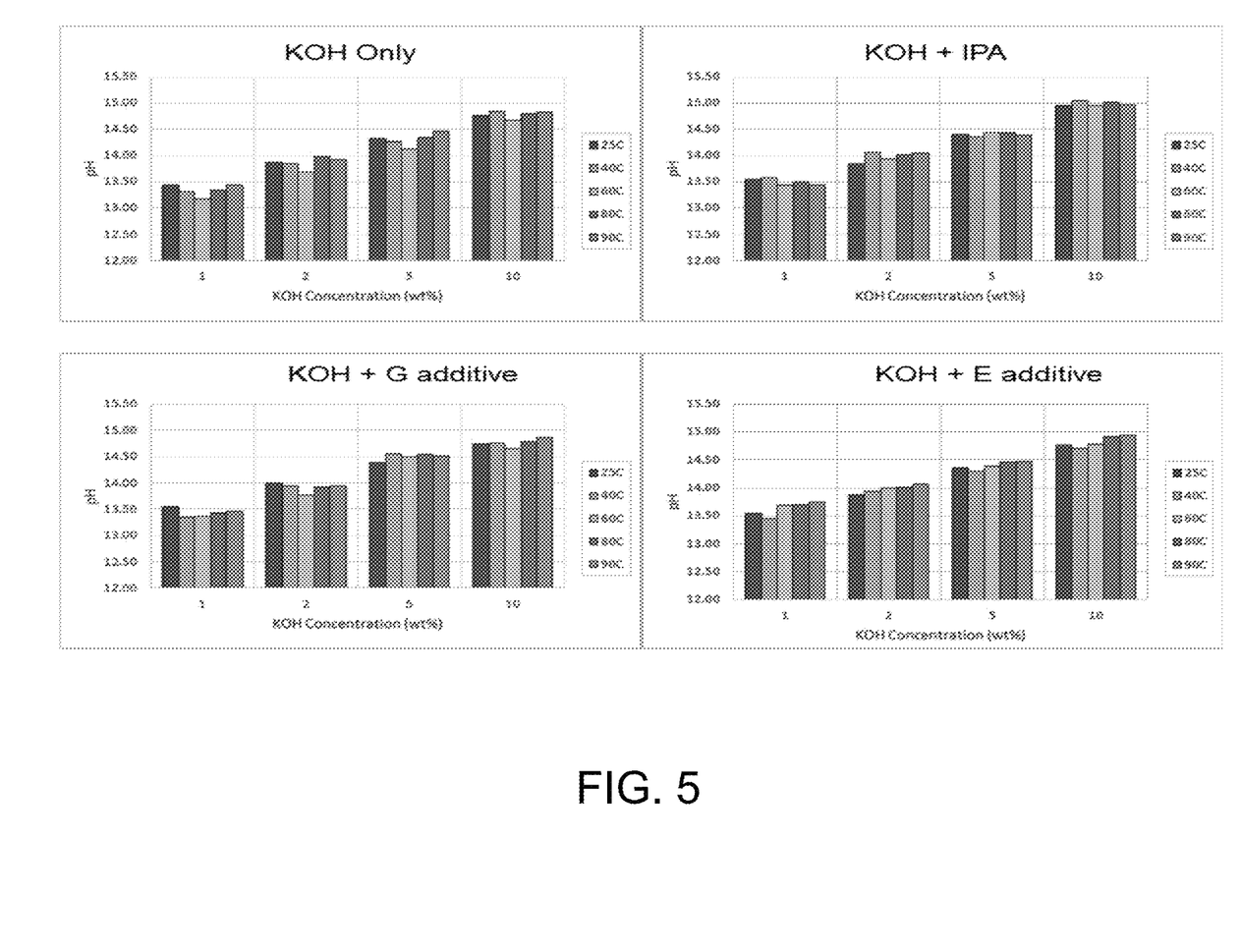
FIG. 5 is a graph illustrating pH value with respect to change in temperatures of etchant solution using the feed and bleed method according to some embodiments of the present invention.

Furthermore, as shown in FIGS. 4 and 5, the relationship between pH and conductivity used by the control process further overcomes the difficulties associated with increased temperatures. Change in temperature has less impact on the change in measured pH value as compared to conductivity. Therefore, by monitoring known etching parameters (e.g., temperature), the control process allows for previously insignificant conductivity measurements to become significant data for measuring minor changes in etchant concentration—even at elevated temperatures. The correlation between measure pH and conductivity is the basis for the control process that uses conductivity measurements to maintain a concentration of etchant in a circulation volume of an etchant solution during substrate etching.

Using the control process, the system of the present invention can maintain a concentration of an etchant in a circulation volume of an etchant solution by measuring the conductivity of circulation volume. FIG. 1 provides a non-limiting schematic illustration of the system 100 according to some embodiments of the present invention. The system 100 comprises a closed-loop circulation system 15 comprising a process chamber 10, an overflow chamber 11 (which can be considered a part of the process chamber 10) and a recirculation line 60. The recirculation line 60 is fluidly coupled to the process chamber 10. The closed-loop circulation system 15 is configured to circulate a circulation volume of an etch solution.

The system 100 further comprises a controller 50—also referred to as a central processing unit (CPU). The system 100 may further comprise a means for adding fresh etchant solution to the circulation volume of the etchant solution, such as a deionized water (DIW) supply 20 and at least a first chemical supply 30, such as etchant. In some embodiments of the present invention the system 100 further comprises a second chemical supply 40, such as IPA. The number of chemical supplies can be altered based on the number of chemicals that are needed in the etching solution. Thus, in certain embodiments only one chemical supply is needed and in other embodiments more than two chemical supplies may be needed.

The system 100 may comprise a means for bleeding contaminated etchant solution from the circulation volume of the etchant solution, such as a bleed line 90 having a bleed valve 91. The bleed line 90 is fluidly coupled to a bleed port of the process chamber 10 so that liquids can be drained from the volume of the process chamber 10 during wafer processing. The bleed valve 91 is adjustable so that the flow rate of fluids through tire bleed line 90, and thus out of the closed-loop circulation system 15, can be controlled.

The system 100 further comprises a conductivity sensor 70 operably coupled to the closed-loop circulation systems 15. The conductivity sensor 70 being configured to repetitively measure conductivity of the circulation volume of the etchant solution. According to some embodiments, the conductivity sensor 70 is located within the recirculation line 60. The recirculation line 60 may further comprise a pump 80 and a heater 85 (i.e., the conductivity sensor 70, the pump 80 and the heater 85 are operably coupled to the recirculation line 60).

In the exemplified embodiment, the DIW supply 20 is fluidly connected to a DIW dispenser 21, the first chemical supply 30 is fluidly connected to a first chemical dispense line 31, and the second chemical supply 40 is fluidly coupled to a second chemical dispense line 41. Each of the dispense lines 21, 31, 41 is positioned so as to flow the respective fluid from the respective supply into the process chamber 10 as desired and/or needed to maintain the mixture in the process chamber 10 with a desired concentration ratio and a desired etch by-product level. More specifically, the DIW dispense line 21 comprises a first, valve 22, the first chemical, dispense line 22 comprises a second valve 32 and the second chemical dispense line 30 comprises a third valve 42. The valves 22, 32, 42 are adjustable valves that are operably coupled to their respective dispense lines 21, 31, 41 to control the flow of the respective fluids there through and into the process chamber 10.

In use, the process chamber 10 is filled with the etching solution until the etching solution overflows the process chamber 10 into the overflow chamber 11. In some embodiments, the process chamber 11 may be fully filled or partially filled. In a non-limiting example, in use the etching solution (comprising KOH, IPA and DIW) is supplied to the closed-loop circulation system 60 to form a mixture having a target concentration ratio and a predetermined volume. The mixture is made to have a specific concentration ratio by opening the valves 22, 32, 42 for a set period of time at a set flow rate to ensure that the proper amount of each chemical (KOH, IPA and DIW) is provided in the mixture by the controller 50 as discussed in more detail below. The mixture is made to fill the process chamber 10 and overflow into the overflow chamber 11 and into the recirculation line 60.

Upon reaching the overflow chamber 11, the etching solution will flow or be pumped via the pump 80 through the recirculation line 60. During flow through the recirculation line 60, the etching solution will pass through the conductivity sensor 70 so that the conductivity of the etching solution can be taken, as discussed in more detail below. Upon passing the conductivity sensor 70, the etching solution will continue to flow through the recirculation line 60 until it is fed back into the process chamber 10. This flow of the etching solution through the closed-loop circulation system 15 (i.e., through the process chamber 10 and the recirculation line 60) can be continuous in certain embodiments, or at various time periods as desired. Continuous circulation can be desired in certain embodiments so that continuous measurements of the etching solution can be taken by the conductivity sensor 70.

Each of the first, second and third valves 22, 32, 42 and the conductivity sensor 70 are operably coupled to the controller 50 for communication therebetween. Furthermore, the bleed valve 91 is also operably coupled to the controller 50. These operable connections can be facilitated via the appropriate electric, fiber-optic, cable or other suitable connections, which are illustrated in dashed lines in FIG. 1. The controller 50 is a suitable microprocessor based programmable logic controller, personal computer or the like for process control and preferably includes various input/output ports used to provide connections to the various components of the etching system 100 that need to be controlled and/or communicated with.

The controller 50 employs the control process of the present invention, as discussed herein. The controller 50 also preferably comprises sufficient memory to store process recipes, parameters, and other data, such as a predetermined (i.e., target) concentration ratio, a predetermined etch by-product particle count, a predetermined range, flow rates, processing times, processing conditions, and the like. The controller 50 can communicate with any and all of the various components of the etching system 100 to which it is operably connected in order to automatically adjust process conditions, such as activating flow through any one of the feed lines 21, 31, 41 either alone or in combination, activating flow through the bleed line 90, pump activation, heat application, and filtering. While not illustrated, the central processing unit 50 can also be operably coupled to the heater 85 and the pump 80 if desired.

The controller 50 is also programmed with the proper algorithms to receive data signals from the conductivity sensor 70, analyze the incoming data signals, compare the values represented by the incoming data signals to stored relationship with etchant concentration and pH value and automatically make the appropriate adjustments to the etchant being used to process the wafers by feeding fresh etchant components into the circulation via lines 21, 31, 41 and/or bleeding contaminated/old etchant via the bleed line 90 to achieve a predetermined characteristic within the etchant mixture. For example, the controller 50 can store a predetermined conductivity value that has an assigned relationship to the corresponding pH value and etchant concentration. The controller 50 may further comprise a predetermined acceptable operating range for measured conductivity or concentration ratio and/or etchant by-product. More specifically, the controller 50 can be set to store a desired concentration ratio of the KOH, the IPA and the DIW in the etching solution that flows through the closed-loop recirculation system 15.

To etch a substrate, the system may be operated according to an etching method. The etching method includes immersing at least one substrate in an etchant solution within the process chamber 11. The term "immersing" includes substrates that are fully as well as partially immersed in etching solution. The etchant solution comprises an etchant selected from compounds such as nitric acid ($HNO_3$), hydrofluoric acid (HF), potassium hydroxide (KOH), sodium hydroxide (NaOH), and tetramethylammonium hydroxide (TMAH). The etchant solution may further comprise an amount of deionized water as well as other additives, such as isopropyl alcohol (IPA) as well as organic surfactants. The etchant solution has a target concentration of etchant that ranges from 0.5 wt. % to 20 wt. % based on the total weight of the etchant solution. In some embodiments, the etchant is present in an amount ranging from 1 wt. % to 10 wt. % based on the total weight of the etchant solution—including all integers therebetween. The target concentration may be selected based on the type of substrate to be etched as well as the type of etching process to be employed. The substrate may be selected from materials such as silicon (Si), silicon dioxide ($SiO_2$) or silicon nitride ($Si_3N_4$).

The process chamber 11 is operably coupled to the recirculation line 60 to form the closed-loop circulation system 15. Once the substrate is immersed, at least three steps are performed. In a first step (1), a circulation volume of the etchant solution is circulated through the closed-loop circulation system 60. The circulation volume may be a predetermined volume that remains substantially constant during the etching method. The circulation volume of the etchant, solution may be circulated through the closed-loop circulation system for a predetermined amount of time at a predetermined flow rate.

In a second step (2), the conductivity of the circulation volume of the etchant solution that is circulating through the closed-loop circulation system is then repetitively measured by the conductivity sensor 70 for a period of time. Specifically, the conductivity of the circulation volume of the etchant solution that is circulating through the closed-loop circulation system is measured a plurality of times by the conductivity sensor. The plurality of measurements is used to determine an average measured conductivity of the etchant solution. The period of time is a non-zero period of time.

In a third step (3), the controller 50 uses the control process and compares the average measured conductivity of the circulation volume of the etchant solution with a lower threshold of conductivity that is stored or determined in the controller 50. In some embodiments, the controller 50 may also compare the average measured conductivity of the circulation volume of the etchant solution with an upper threshold of conductivity that is stored or determined in the controller 50.

The lower threshold of conductivity may be a predetermined value that is stored or calculated by the controller 50 using the control process. The predetermined value indicates a minimum amount of conductivity the etchant solution may have before fresh etchant must be added to replenish the amount of etch consumed by the etching reaction. Upon detecting that that the average measured conductivity of the circulation volume of the etchant solution is at or below the lower threshold of conductivity, the controller 50 automatically performs a feed and bleed event. The feed and bleed event includes a first event (i) of bleeding a volume of the contaminated etchant solution from the circulation volume of the etchant solution via the bleed line 90 by opening the bleed valve 91. The feed and bleed event includes a second event (ii) of adding fresh etchant solution to the circulation volume of the etchant solution to increase the conductivity of the circulation volume of the etchant solution.

The fresh etchant that is added to increase the overall etchant concentration in the circulation volume, thereby raising the conductivity of the circulation volume to a value that is that is greater than the lower threshold of conductivity. In some embodiments, the fresh etchant solution that is added to the circulation volume of the etchant solution during the second event (ii) of the feed and bleed step has concentration of the etchant that is greater than the target concentration of the etchant in the circulation volume of the etchant solution. Introducing fresh etchant that is more concentrated than the target concentration allows for the overall concentration of the circulation volume to increase, thereby raising the conductivity of the circulation volume of the etchant solution above the lower threshold of conductivity.

In some embodiments, the first event (i) and the second event (ii) of the feed and bleed are performed contemporaneously. In some embodiments, the first event (i) of the feed and bleed is initiated prior to initiating the second event (ii) of the feed and bleed. In some embodiments, the first event (i) of the feed and bleed is completed before initiating the second event (ii) of the feed and bleed. During the second event (ii) of the feed and bleed, a volume of fresh etchant that is added to the circulation volume of the etchant solution is substantially equal to the volume of contaminated etchant bled from the circulation volume of the etchant solution in the first event (i) of the feed and bleed.

The lower threshold of conductivity is indicative of a lower threshold of etchant concentration in the circulation volume of the etchant solution. Similarly, the upper threshold of conductivity is indicative of an upper threshold of etchant concentration in the circulation volume of the etchant solution. Using the control process of the present invention, each of the upper and lower thresholds of concentration is within a predetermined range of the target concentration of etchant in the circulation volume of the etchant solution. Specifically, the control process of the present invention provides that the predetermined range have a much narrower window of statistical distribution as compared to previous concentration measuring methods based on solution conductivity.

The upper threshold of conductivity may be a predetermined value that is stored or calculated by the controller 50 using the control process. The predetermined value indicates a maximum amount of conductivity the etchant solution may have before additional DIW must be added to the circulation volume (with a corresponding volume bleed of circulation volume) to dilute the concentration of the etchant in the etchant solution. Upon detecting that that the average measured conductivity of the circulation volume of the etchant solution is above the upper threshold of conductivity, the controller 50 may automatically dilute the circulation volume.

Using the control process of the present invention, the range defined by the upper threshold of etchant concentration and the lower threshold of etchant concentration may be much smaller as compared to other systems that use solution conductivity as a direct measure of etchant concentration. Specifically, by using the control process of the present invention, the upper threshold of etchant concentration may range from 101% to 120% of the target concentration value—including all integers therebetween. Similarly, by using the control process of the present invention, the lower threshold of etchant concentration may range from 80% to 99% of the target concentration value—including all integers therebetween.

Steps (1), (2), and (3) of the etching method may be repeated in sequence for a number of cycles. In some embodiments, the number of cycles is a plurality—i.e. at least 2. After completion of the cycles, the etching method may further comprise a fourth step (4) that occurs subsequent to step (3). During step (4), the conductivity of the circulation volume of the etchant solution may be measured by the controller 50, however, the conductivity measured by the controller 50 during this step (4) is not considered by the controller 50 for determining whether a subsequent feed and bleed event should be initiated. Step (4) occurs for a period of mixing time that last for a non-zero period of time. The period of mixing time allows for proper mixing of fresh etchant solution with the previous etchant solution already present in the process chamber 11.

Before, during, or subsequent to steps (1), (2), and (3), the etching method may further include repetitively measuring the temperature of the circulation volume of the etchant solution that is circulating through the closed-loop circulation system 15 with a temperature sensor (not pictured) operably coupled to the to the closed-loop circulation systems 15. The circulation volume of the etchant solution that is circulating through the closed-loop circulation system 15 may be heated by the heater 85 and the temperature of the circulation volume of the etchant solution may range from 25° C. to 90° C. In some embodiments, the control process employed by the controller 50 to evaluate etchant concentration of the circulation volume in the closed-loop circulation system 15 is temperature dependent. In some embodiments, the control process employed by the controller 50 to evaluate etchant concentration of the circulation volume in the closed-loop circulation system 15 is not temperature dependent.

In some embodiments, step (3) may further include repetitively measuring the temperature of the circulation volume of the etchant solution that is circulating through the closed-loop circulation system 15. Subsequently during step (4), the controller 50 uses the control process to establish the upper threshold of conductivity and the lower threshold of conductivity based on the temperature measured in step (3)—thereby allowing for real-time adjustments of the upper and lower thresholds of conductivity. In some embodiments, the etchant solution that is circulating through the closed-loop circulation system 15 is maintained at a substantially constant temperature—causing the upper and lower thresholds of conductivity to be beast, at least in part, on the substantially constant temperature.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A method of etching material from at least one substrate, the method comprising:
   a) circulating a circulation volume of an etchant solution through a first closed-loop system and in contact with at least one silicon substrate to etch silicon from the at least one silicon substrate, the circulation volume of the etchant solution being at a known temperature;
   b) measuring conductivity of the circulation volume of the etchant solution circulating through the first closed-loop system;
   c) measuring pH of the circulation volume of the etchant solution circulating through the first closed-loop system; and
   d) assigning an etchant concentration value to the measured conductivity of step b) based on the measured pH of step c);
   e) measuring conductivity of a second closed-loop system and comparing against the etchant concentration value and perform a feed-and-bleed event to the second closed-loop system based on the etchant concentration value obtained from the first closed-loop system;
   wherein the second closed-loop system is configured to etch a material.

2. The method of claim 1 further comprising:
   f) repetitively performing steps a) through e); and
   wherein subsequent to the performance of step e), the pH of the etchant solution is not considered for determining whether a subsequent feed-and-bleed event should be initiated for a mixing period of time.

3. The method of claim 1 wherein during step e) a volume of fresh etchant that is added to the circulation volume of the etchant solution that is substantially equal to the volume of contaminated etchant solution bled from the circulation volume of the etchant solution.

4. The method of claim 3 wherein the circulation volume of the etchant solution has a target concentration of an etchant, and wherein the fresh etchant solution added has a concentration of the etchant that is greater than the target concentration of the etchant in the circulation volume of the etchant solution.

5. The method of claim 1 wherein the etchant solution is maintained at a substantially constant temperature.

6. The method of claim 1 wherein the circulation volume in step b) is held at a temperature ranging from 25° C. to 90° C.

7. The method of claim 1 wherein the etchant solution comprises an etchant selected from the group consisting of KOH, NaOH, TMAH, HF, and combinations thereof.

8. A method of etching material from at least one substrate, the method comprising:
   a) circulating a circulation volume of an etchant solution through a first closed-loop system and in contact with at least one silicon substrate to etch silicon from the at least one silicon substrate, the circulation volume of the etchant solution being at a known temperature;
   b) measuring conductivity of the circulation volume of the etchant solution in the first closed-loop system with a conductivity sensor for a predetermined period of time, wherein a lower threshold of conductivity is indicative of a lower threshold of etchant concentration in the etchant solution and an upper threshold of conductivity is indicative of an upper threshold of etchant concentration in the etchant solution, and wherein each of the upper and lower thresholds of concentration are within a predetermined range of a target etchant concentration of the etchant solution;
   c) repetitively measuring pH of the circulation volume of the etchant solution circulating through the first closed-loop system; and
   d) assigning an etchant concentration value to the measured conductivity of step b) based on the measured pH of step c);
   e) measuring conductivity of a second closed-loop system and comparing against the etchant concentration value and perform a feed-and-bleed event to the second closed-loop system based on the etchant concentration value obtained from the first closed-loop system;
   wherein the second closed-loop system is configured to etch a material.

9. The method of claim 8, wherein subsequent to the performance of step d), pH of the second closed-loop system is not considered for determining whether the feed-and-bleed event should be initiated in the second closed-loop system.

* * * * *